(12) United States Patent
Fujisawa

(10) Patent No.: US 8,730,580 B2
(45) Date of Patent: May 20, 2014

(54) LIGHT DIFFUSION CELL FOR LASER LIGHT, LIGHT SOURCE DEVICE AND IMAGE DISPLAY DEVICE USING SAME

(75) Inventor: Hideyoshi Fujisawa, Tokyo (JP)

(73) Assignees: Nippon Kayaku Kabushiki Kaisha, Tokyo (JP); Polatechno Co., Ltd., Niigata (JP)

( * ) Notice: Subject to any disclaimer, the term of this patent is extended or adjusted under 35 U.S.C. 154(b) by 396 days.

(21) Appl. No.: 13/124,949

(22) PCT Filed: Oct. 20, 2009

(86) PCT No.: PCT/JP2009/005483
§ 371 (c)(1),
(2), (4) Date: Apr. 19, 2011

(87) PCT Pub. No.: WO2010/047089
PCT Pub. Date: Apr. 29, 2010

(65) Prior Publication Data
US 2011/0199686 A1 Aug. 18, 2011

(30) Foreign Application Priority Data
Oct. 23, 2008 (JP) .................................. 2008-272789

(51) Int. Cl.
*G02B 5/02* (2006.01)
(52) U.S. Cl.
USPC ........................................... 359/599; 359/452
(58) Field of Classification Search
USPC ........................... 359/443, 449, 450, 452, 599
See application file for complete search history.

(56) References Cited

U.S. PATENT DOCUMENTS 3,650,608 A * 3/1972 Baker ............................. 353/69
4,140,369 A * 2/1979 Howland ...................... 359/452

(Continued)

FOREIGN PATENT DOCUMENTS

| JP | 10-115805 A | 5/1998 |
| JP | 11-218726 A | 8/1999 |

(Continued)

OTHER PUBLICATIONS

J. Kestin, M. Sokolov, W. A. Wakeham, 'Viscosity of Liquid Water in the Range -8 deg C to 150 deg C', J. Phys. Chem. Ref. Data, vol. 7, No. 3, 1978, pp. 941-948.*

(Continued)

*Primary Examiner* — Arnel C Lavarias
(74) *Attorney, Agent, or Firm* — Nields, Lemack & Frame, LLC

(57) ABSTRACT

A light diffusion cell for laser light where in a transparent cell in which a liquid can be sealed, a fine particle dispersion in which fine particles having an average particle size of 100 nm or more and 1.5 µm or less are colloidally dispersed in a liquid medium transmitting light, a same light diffusion cell including a reflection mechanism recursively using reflection light of incident light, a laser light source device including the light diffusion cell and a semiconductor laser light source and an image display device including the light diffusion cell or the laser light source device, and the light diffusion cell significantly reduces or removes speckle noise of semiconductor laser light. In addition, the light diffusion cell has an easy constitution, occupies a smaller volume and can be easily incorporated in any type of image display device using laser light. Therefore, it is possible to significantly reduce or remove speckle noise without large-sizing of an image display device using laser light or a higher cost-up.

12 Claims, 1 Drawing Sheet

(56) References Cited

U.S. PATENT DOCUMENTS

| | | | | |
|---|---|---|---|---|
| 4,401,368 | A | * | 8/1983 | Drechsel et al. ............... 359/452 |
| 5,416,617 | A | * | 5/1995 | Loiseaux et al. .................. 349/1 |
| 6,092,900 | A | * | 7/2000 | Diedrich et al. ............. 353/122 |
| 6,426,836 | B2 | * | 7/2002 | Dorsel et al. ................. 359/443 |
| 6,819,487 | B2 | * | 11/2004 | Palovuori et al. ............. 359/443 |
| 7,304,795 | B2 | * | 12/2007 | Yavid et al. ................... 359/443 |
| 7,399,084 | B2 | | 7/2008 | Morikawa et al. |
| 7,522,792 | B2 | * | 4/2009 | Sugita et al. .................... 385/50 |
| 8,199,333 | B2 | * | 6/2012 | Wegmann ..................... 356/515 |
| 8,310,756 | B2 | * | 11/2012 | Choi ........................... 359/443 |
| 2001/0007510 | A1 | | 7/2001 | Dorsel et al. |
| 2007/0297050 | A1 | * | 12/2007 | Seki et al. ..................... 359/446 |
| 2008/0062517 | A1 | * | 3/2008 | Seki .............................. 359/452 |
| 2008/0151196 | A1 | * | 6/2008 | Kinoshita ....................... 353/69 |

FOREIGN PATENT DOCUMENTS

| | | |
|---|---|---|
| JP | 2001-100316 A | 4/2001 |
| JP | 2007-163926 A | 6/2007 |
| JP | 2007-333948 A | 12/2007 |
| WO | 2005/098532 A1 | 10/2005 |

OTHER PUBLICATIONS

International Search Report dated Nov. 24, 2009 in corresponding foreign patent application No. PCT/JP2009/005483.

* cited by examiner

LIGHT DIFFUSION CELL FOR LASER LIGHT, LIGHT SOURCE DEVICE AND IMAGE DISPLAY DEVICE USING SAME

TECHNICAL FIELD

The present invention relates to a light diffusion cell for laser light to remove speckle noise generated in displayed images by laser light from a laser light source used in an image display device such as a liquid crystal display, and a laser light source device and an image display device using this.

BACKGROUND ART

Recently, there is a trend to use a semiconductor laser for a light source of an image display device. Conventionally as these light sources, extra high pressure mercury lamps, LEDs and the like have been used. However, improvement of color reproductivity and expansion of color representation range are always required. The laser light obtained by induced emission has a very narrow band emission spectrum, whereby it has an excellent ability to represent a pure color. In addition, when 3 primary colors (red, green and blue) by the laser are combined, it is excellent in terms of the capability of representation in a very high color range compared with conventional light sources. Therefore, it is an attractive light source for image display devices. And at present, the problems of the size of visible light laser generator, power consumption, cost and the like which were obstacles to practical use have been overcome, and in practice, large-size rear-projection televisions capable of representing in a wide color range where a semiconductor laser is a light source are produced.

It is known that when a combination of 3 kinds of laser light (for example, blue: 460 nm, green: 532 nm, red: 635 nm) corresponding to the above-mentioned 3 primary colors is used, a range of 150 to 170% of the NTSC color range can be secured and pictures closer to the real thing than those on any other existing type of display can be obtained. For example, the color range which CRT displays can represent using a cathode ray tube is 60 to 70% of the NTSC color range and superior compared with the liquid crystal display, but it is considerably narrow compared with the color range which the combination of the above-mentioned 3 kinds of laser light can represent.

In this regard, the above-mentioned NTSC color range is based on the standard for the color range of analog television, designed by National Television System Committee (NTSC) in the U.S.A.

As mentioned above, the combination of the 3 primary colors of laser light is excellent in representing the color range but poses the problem of generating speckle noise when applied as it is. Specifically, the light emitted from a laser light source is a coherent light which is very susceptible to interference, whereby its application to image displays as it is results in constant occurrence of light ununiformity called speckle noise which is a flickering of the bright part and the dark part all over the image finally projected. Therefore, when the laser light is used as it is, the visibility ends up being worse compared with image display devices using a light source conventionally used. In order to improve that and to use a semiconductor laser as a light source for image display devices, it is essential to prevent adverse effects on visibility by reducing or removing speckle noise so as to make its light more incoherent. In this regard, the projected light without speckle noise is called incoherent light.

Various solutions to this problem have been proposed. For example, Patent Literature 1 discloses a method of moving a speckle pattern of the image projected on a screen by passing the laser light through a rotating diffusion element (for example, ground glass). When the rotating speed of the diffusion element is high enough, the eyes of viewers cannot detect the speckle and the speckle seems to disappear. However, it is necessary to mount a mechanism of rotating the diffusion element on an image display device, leading to a disadvantage of complication for the image display device.

Patent Literature 2 describes a device of the type which displays images by scanning on the screen using a laser light. In said device, by using a lenticular lens where cylindrical lenses are periodically arrayed in the scanning direction on the screen, a light incident angle on the focus of the lens is changed in accordance with the advancement of scanning laser light and a speckle pattern of the light projected on the screen is also changed, resulting in reduction of speckle noise. This device has an advantage of not using a driving mechanism but inevitably needs a special screen for projection. In addition, it has many limits such that it can be used only for scanning-type devices.

Patent Literature 3 and Patent Literature 4 disclose a technique to produce a fiber bundle element leading to reduction of speckle noise of laser light. It is characterized by using a fiber bundle consisting of many optical fibers, where the difference in length of any two optional fibers is larger than the coherence length of a light source. A larger number of optical fibers leads to more reduction of speckle noise. Therefore, in order to get a fiber bundle with good performance, dozens to hundreds of optical fibers different in length are required. This is thought to lead to a high manufacturing cost. In addition, a relatively large volume seems to be required in order to incorporate said bundle into a device and this cannot be said to be advantageous for incorporating into an image display device using a conventional laser light source.

Patent Literature 5 relates to a laser lighting optical device and discloses a method for reducing speckle noise by split-reflecting a light flux in its optical system using a plurality of stepped reflecting mirrors with optical path difference. In this method, spatial coherence is reduced by making the optical path length of the split light flux longer than the coherent length. As a result, a light flux with low interference is synthesized and speckle noise is reduced. In this method, a more split-number of the stepped reflecting mirror leads to a larger reduction effect on speckle noise. Therefore, it is considered that as the reduction effect is increased, a larger volume of the part removing speckles is required, and the same problem as in the case of the fiber bundle in Patent Literature 3 and Patent Literature 4 seems to be posed.

Patent Literature 6 discloses a method for reducing speckle noise, using a device comprising both a diffusion element into which a fluid component consisting of a fine particle dispersoid and a translucent dispersion medium are sealed and a fine particle oscillation-applying means by micro oscillation of the dispersoid (fine particle) by the oscillation-applying means when coherent laser light is passed through the element. In this method, said micro oscillation is forcibly performed by change in the alternating electric field, change in the magnetic field, or the ultrasonic wave (and so on). The speckle pattern of the diffused laser light diffused by said micro oscillation of said fine particles randomly changes at a high speed. People cannot detect the speckle pattern randomly changing at a high speed and speckle noise is thus removed. This method has, compared with the method requiring a mechanically driving part in Patent Literature 1 and the like, a possibility to make it smaller. However, said Patent Literature 6 provides no specific, technical disclosure relating to the average particle size of fine particles, the strength of electric field, magnetic field or ultrasonic wave, concentration of the fine particle in a dispersion and the like, nor practical disclosure about the way of controlling these and the degree of removing speckle, resulting in disclosure of nothing more than an idea.

TECHNIQUE LITERATURE

Patent Literature

Patent Literature 1: JP 6-208089 A
Patent Literature 2: JP 5-173094 A
Patent Literature 3: JP 6-167640 A
Patent Literature 4: JP 11-223795 A
Patent Literature 5: JP 7-335523 A
Patent Literature 6: JP 11-218726 A

DISCLOSURE OF THE INVENTION

Problems to be Solved by the Invention

As mentioned above, the visible light source using a semiconductor laser has a narrow wavelength range of light emission spectrum lines and can represent a highly pure monochrome, resulting in that the image display device has excellent color reproductivity, but reduction or removal of speckle noise is required as mentioned above. The means of reducing or removing speckle noise in the above-mentioned Patent Literatures 1 to 6 and the like is known but the techniques described there include various problematic points as mentioned above. Therefore, development of a more convenient means of removing speckle noise is required.

Means of Solving the Problems

The present inventors have intensively studied to solve the above problems and found that a dispersion where fine particles having a certain average particle size are dispersed stably in a colloidal state can unexpectedly make it possible to convert laser light to incoherent light by Brownian motion of the fine particles without means of forced oscillation from outside and thus to significantly remove speckle noise, and the present invention has been completed.

That is, the present invention relates to a light diffusion cell for laser light where a fine particle dispersion containing fine particles having a particle size of 100 nm or more and 1.5 µm or less and a liquid medium transmitting light is sealed in a transparent cell having at least two opposing substrates in which a liquid can be sealed; said light diffusion cell comprising a reflection mechanism recursively using reflecting light of incident light; a laser light source device comprising any of the above light diffusion cells and a semiconductor laser light source for laser light incident on said light diffusion cell; and an image display device comprising said light diffusion cell or said light source device. Hereinafter, the present invention will be more specifically explained.

That is, the present invention relates to:
(1) A light diffusion cell for laser light where a fine particle dispersion containing fine particles having a particle size of 100 nm or more and 1.5 µm or less and a liquid medium transmitting light is sealed in a transparent cell in which a liquid can be sealed,
(2) The light diffusion cell for laser light according to the above (1), wherein the fine particle dispersion is latex or a dispersion of inorganic fine particles,
(3) The light diffusion cell for laser light according to the above (2), wherein the dispersed fine particles in latex are acryl polymer fine particles or styrene polymer fine particles,
(4) The light diffusion cell for laser light according to the above (2), wherein the inorganic particles are aluminum oxide fine particles,
(5) The light diffusion cell for laser light according to any one of the above (1) to (4), wherein latex or a dispersion of inorganic fine particles is a dispersion having a viscosity of 0.1 mPa·s or more and 10000 mPa·s or less,
(6) The light diffusion cell for laser light according to any one of the above (1) to (5), wherein the transparent cell has a whole light transmittance rate of 85% or more and is comprised of an inorganic material or a plastic material,
(7) The light diffusion cell for laser light according to any one of the above (1) to (6), which has a reflection mechanism on the incident side of laser light to reflect backward scattering light from said light diffusion cell to the emission side of laser light, in laser light of the light diffusion cell for laser light,
(8) The light diffusion cell for laser light according to any one of the above (1) to (7), wherein the light utilization rate in the fine particle dispersion in a state of being filled in the light diffusion cell for laser light is 60 to 95%,
(9) A light source device comprised of the light diffusion cell for laser light according to any one of the above (1) to (8) and a semiconductor laser light source,
(10) An image display device equipped with a light source device comprised of the light diffusion cell for laser light according to any one of the above (1) to (8) and a semiconductor laser light source,
(11) The image display device according to the above (10), which is a front projector or a rear projection type display,
(12) The image display device according to the above (10) or (11), which is a backlight type liquid crystal display device,
(13) A method for reducing laser speckle noise, wherein coherent laser light is turned to incoherent emission light by transmitting through a light diffusion cell for laser light where a fine particle dispersion containing fine particles having an average particle size of 100 nm or more and 1.5 µm or less and a liquid medium transmitting light is sealed in a transparent cell in which a liquid can be sealed or through the light diffusion cell for laser light according to any one of the above (2) to (8).

Effect of the Invention

In the light diffusion cell for laser light of the present invention, it is not necessary to forcibly oscillate or move the fine particles by external power, and only by placing said light diffusion cell of the present invention in the passage of laser light and by passing laser light, coherent laser light can be turned to incoherent laser light and speckle noise can be effectively reduced or removed. In addition, said light diffusion cell can sufficiently remove speckle noise even though the thickness of the dispersion is only about 0.5 mm to 5 mm, whereby it is a speckle noise-removing element having a small occupied volume and comprising a small number of components, resulting in that it can be easily incorporated into a conventional different laser light source device or an image display device. For example, it can be used for an image display device such as a front projector, a rear projection type display and a liquid crystal display device having a backlight. In addition, because the speckle noise-removing element does not need an oscillating/driving device or an electric circuit, the image display device in which it is incorporated does not need an extra occupied volume and speckle noise can be easily removed without large-sizing or increasing the number of components.

MODE FOR CARRYING OUT THE INVENTION

Figure 1:
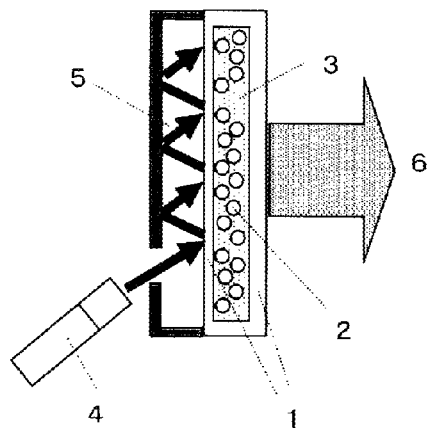
FIG. 1 is a sectional drawing showing one example of the embodiments of the light source device of the present invention having a semiconductor laser light source and the light diffusion cell for laser light with a reflection mechanism of the present invention.

The present invention will be specifically explained.

The light diffusion cell for laser light of the present invention is used for removing speckle noise seen in projection images with laser light. Said light diffusion cell is comprised of a transparent cell in which a liquid can be sealed and a fine particle dispersion sealed in the cell where fine particles having an average particle size 100 nm or more and 1.5 μm or less are colloidally dispersed in a light transmissive liquid medium.

The transparent cell in which a liquid can be sealed (1 of FIG. 1 and 1 of FIG. 2) has at least two opposing transparent substrates and is preferably a cell (container) where a liquid can be sealed between the substrates. The transparent cell preferably has a higher transparency, and in particular as for the two opposing substrates corresponding to the incident side and the emission side of the laser light, the higher transmittance of laser light from the laser light source, the more preferable. The whole light transmittance rate of laser light when said transparent cell is empty is 80 to 100%, preferably 85 to 100% and further preferably 90 to 100%. For example, said transparent cell consists of a glass material or a plastic material, preferably one not absorbing laser light used. The materials of said transparent cell will be described later.

The fine particles (in 2 of FIG. 1 and in 2 of FIG. 2) dispersed in the liquid medium (light transmissive liquid medium) has an average particle size of 100 nm or more and 1.5 μm or less. In the dispersion where these fine particles are colloidally dispersed, the general natures which colloids have, specifically Tyndall phenomenon and Brownian motion are observed. When laser light is transmitted through this dispersion, coherent incident light is turned to incoherent emission light and speckle noise generated in projection image with laser light is removed. This is that laser light emitted from a laser light source and entered in said light diffusion cell is scattered by Tyndall phenomenon and also the scattered pattern is randomly changed by Brownian motion of said fine particles. It is considered that as a result, spatial coherence of the laser light is decreased and speckle noise is effectively reduced.

In addition, in the image display device using laser light of the present invention, it is desired that the whole light transmittance rate of laser light entering the light diffusion cell of the present invention is larger. However, due to large backward scattering in Tyndall phenomenon, in a preferable aspect of the light diffusion cell of the present invention, the whole light transmittance rate is improved by comprising a reflection mechanism recursively using light scattered backward (backward scattering light) (specifically, reflection mechanism where scattering light toward the incident side of laser light is reflected to the emission side of laser light) (in 5 of FIG. 1 and in 5 of FIG. 2). In the light diffusion cell of the present invention having a reflection mechanism, light scattered backward is recursively reflected forward (in the emitting direction of laser light) by said reflection mechanism and emitted with forward scattering light. The total of forward scattering light and recursively reflecting light (light reflected by the reflection mechanism and emitted toward the emitting direction of the laser light) is diffusion light (in FIG. 1 and in 6 of FIG. 2) emitted by the light diffusion cell (or the light source device) of the present invention.

The whole light transmittance rate of laser light {(transmitted light amount/incident light amount)×100} in the light diffusion cell of the present invention (without a reflection mechanism) is preferably 50 to 90%, more preferably 60 to 90% and further preferably 70 to 90%, and the whole light transmittance rate when comprising a reflection mechanism is 60 to 95%, more preferably 70 to 95% and further preferably about 75 to 95%.

In the light diffusion cell or the light source device of the present invention, it is important that the fine particles dispersed in the liquid medium conducts Brownian motion in order to reduce speckle noise. For example, the reduction effect on speckle noise is not observed in a dispersion system where the viscosity of medium is high and the degree of freedom of the fine particle motion is low or in a dispersion system where the medium is gelled and the fine particles cannot move.

The dispersion sealed in the above-mentioned diffusion cell of the present invention preferably has such a viscosity that dispersed fine particles can conduct Brownian motion enough to reduce speckle noise when the laser light is transmitted. Therefore in the term, the lower viscosity the dispersion has, the better. However, because it is also necessary that colloidal particles are stably dispersed in the liquid medium, the viscosity of dispersion at 25° C. is usually 0.1 mPa·s or more and 10000 mPa·s or less in the present invention although the preferable range differs from the kind of dispersed fine particles as described later. Said viscosity is more preferably 0.1 mPa·s or more and 5000 mPa·s or less and further preferably 0.1 mPa·s or more and 1000 mPa·s or less. In addition, in terms that the colloidal particles are more stably dispersed in a long-term, said viscosity is 0.5 mPa·s or more and 500 mPa·s or less or preferably 300 mPa·s or less, more preferably 1 mPa·s or more and 100 mPa·s or less and further preferably 50 mPa·s or less. It is most preferably 1 mPa·s or more and 10 mPa·s or less.

The average particle size of the fine particles used in the present invention is about 100 nm or more and 1.5 μm or less and preferably 100 nm or more and 1.2 μm or less. It is more preferably 100 nm or more and 900 nm or less. The speed of Brownian motion is higher as the particle size is smaller, but when the average particle size is too small, the reduction or removal of laser speckle is insufficient or it is not done. On the other hand, the too high average results in a slower speed of Brownian motion, whereby the reduction or removal of laser speckle is insufficient or it is not done. The average particle size somewhat varies depending on the kind of fine particles, but smaller one has a larger speckle-removing action as long as within a certain range, for example, 100 nm or more, preferably 120 nm or more, more preferably 150 nm or more and further preferably 180 nm or more. Therefore, the above-mentioned upper limit of average particle size is one preferable guide, and still more preferably it is 1000 nm or less, further 500 nm or less and further 300 nm or less. A more preferable average particle size is 120 to 1000 nm, further preferably 150 to 500 nm and most preferably 180 to 300 nm.

The fine particle colloidally dispersed in the above-mentioned dispersion (colloid fine particle) includes inorganic fine particles such as silica fine particle, titanium oxide fine particle, aluminum oxide fine particle and inorganic pigment fine particle, organic fine particles such as liposome, micelle, dye fine particle, organic pigment fine particle and latex fine particle (polymer fine particle), and the like.

The colloidal dispersion of these fine particles includes colloidal silica, dispersed silica sol, a colloidal dispersion of titanium oxide fine particles or aluminum oxide fine particles, a dispersed dye liquid, a pigment dispersion, latex and the like. These fine particle dispersions are generally known and commercially available. Among them, latex or a colloidal dispersion of aluminum oxide fine particles is preferable. According to the consideration of the present inventors, when these preferable fine particle dispersions are used, reduction effect of laser speckle is larger compared with the case of using other fine particle dispersions.

The concentration of these fine particles in a colloidal dispersion sealed in the transparent cell may be such a concentration as allows sufficient reduction of laser speckle and its optimum range varies depending on the dispersed fine particles. Usually, to the total amount of the dispersion, it is in the range of 0.01% by weight or more and 70% by weight or less, preferably 0.1% by weight or more and 50% by weight or less, more preferably 25% by weight or less and further preferably 10% or less. In addition, in some cases, said preferable concentration is 0.2% by weight or more and 25% by weight or less and more preferably 10% by weight or less. In the case of latex, it is most preferably 0.2% by weight or more and 5% by weight or less. In the case of inorganic fine particles such as aluminum oxide, it is 1% by weight or more and 10% by weight or less, further preferably 2% by weight or more and 10% by weight or less and most preferably 2% by weight to 7% by weight.

The liquid medium (dispersion medium) in a colloidal dispersion sealed in the transparent cell is preferably a liquid medium not absorbing laser light from a laser light source, usually preferably water or a mixed liquid of a water-miscible organic solvent and water, and most preferably water.

In the present invention, latex means a colloidal dispersion of polymer fine particles and includes both natural latex such as natural rubber latex and synthetic latex.

When the fine particles of these latexes have an average particle size in the above-mentioned range, any of generally known latexes can be used.

Fine particles dispersed in synthetic latex (synthetic latex fine particles) are polymer fine particles obtained by emulsion polymerization of a radical polymerizable monomer. As the polymer fine particle, any can be used as long as its average particle size is in the above-mentioned range, including a homopolymer or a copolymer of a radical polymerizable monomer described later.

The radical polymerizable monomer for synthesis of polymer fine particles used in the present invention can include a vinyl monomer (compound having an ethylenic double bond) which is commonly used for synthesis of a usual polymer. Specifically, it can include a conjugated diene-type monomer, an aromatic vinyl-type monomer (aromatic vinyl monomer), an ethylene-type unsaturated carboxylic acid monomer, a (meth)acrylic acid alkyl ester monomer, a vinyl cyanide-type monomer, a (meth)acrylamide-type monomer, a carboxylic acid vinyl ester-type monomer, amino group-containing ethylenical monomers, halogenated vinyl, a sulfonic acid group- or phosphono group-containing vinyl monomer and the like. These can be used alone or in a combination of 2 kinds or more.

For example, preferable polymer fine particles can include acryl polymer fine particles or styrene polymer fine particles.

The acryl polymer can include a polymer which can be obtained by polymerization of an acryl monomer (monomer having an acryl skeleton) or a polymer which can be obtained by copolymerization of an acryl monomer and a vinyl monomer copolymerizable therewith and which contains the acryl monomer component as the most component whose content is at least 25% by mol or more and preferably 40% by mol or more based on the total components comprising the polymer. For example, the acryl polymer can include a (meth)acrylic acid ester polymer obtained by polymerization of 1 kind or 2-4 kinds of (meth)acrylic acid C1-C12 alkyl ester, a (meth)acryl butadiene polymer by copolymerization of an acryl monomer and butadiene, a (meth)acrylonitrile polymer obtained by single polymerization of (meth)acrylonitrile, an acryl styrene polymer by polymerization of an acryl monomer and a styrene compound monomer, and the like. As the acryl polymer, a (meth)acrylic acid ester polymer is preferable.

On the other hand, the styrene polymer can include a polymer of a styrene compound monomer (monomer having a styrene skeleton) or a polymer which can be obtained by copolymerization of a styrene compound monomer and a vinyl monomer copolymerizable therewith and which contains the styrene compound monomer as the most component whose content is at least 25% by mol or more and preferably 40% by mol or more based on the total components comprising the polymer. For example, the styrene polymer includes polystyrene obtained by single polymerization of styrene, a styrene butadiene polymer, a styrene acryl polymer and the like, and it is preferably polystyrene.

The fine particles of these polymers in the present invention can be obtained by emulsion polymerization. In addition, these polymers may be ones modified by introducing a carboxy group and the like into the polymers.

The acryl monomer (monomer having an acryl skeleton) used in synthesis of a preferable acryl polymer can include at least one kind of acryl monomer selected from the group consisting of (meth)acrylic acid or a salt thereof, (meth)acrylic acid (C1-C12) alkyl ester (which may have a substituent such as a hydroxy group on the alkyl group), a (meth)acrylamide monomer and (meth)acrylonitrile. A monomer other than the acryl component used in synthesis of the acryl polymer can include a vinyl monomer copolymerizable with acryl monomers other than the acryl monomer.

The vinyl monomer copolymerizable with acryl monomers other than the acryl monomer can include a styrene compound monomer (for example, styrene, alpha-methylstyrene and the like), vinyl chloride, vinyl acetate, itaconic acid, crotonic acid, maleic acid, fumaric acid, ethylene, C4 to C8 conjugated diene (for example, 1,3-butadiene, isoprene and chloroprene) and the like, a styrene compound monomer, C4 to C8 conjugated diene or the like is more preferable.

A more preferable acryl polymer is an acryl polymer obtained by polymerization of 1 kind or 2 to 4 kinds of acryl monomers.

In this regard, in the present description, the terms such as "(meth)acrylic acid" or "(meth)acrylonitrile" are used in the meaning of "acrylic acid or methacrylic acid", "acrylonitrile or methacrylonitrile" and the like.

The styrene compound monomer used for synthesis of a preferable styrene polymer can include, for example, a styrene compound having a halogen atom or a C1-C3 alkyl group as a substituent on the benzene ring of styrene or a styrene compound having a C1-C3 alkyl group as a substituent on the vinyl group of styrene, such as styrene, vinyl toluene, ethylvinylbenzene, bromostyrene, chlorostyrene, alpha-methylstyrene and alpha-ethylstyrene.

Preferable vinyl monomers copolymerizable with styrene compound monomers other than the styrene compound monomer can include the above-mentioned acryl monomer, vinyl chloride, vinyl acetate, itaconic acid, crotonic acid, maleic acid, fumaric acid, ethylene, C4 to C8 conjugated diene (for example, 1,3-butadiene, isoprene and chloroprene) and the like.

The styrene polymer is preferably polystyrene as mentioned above.

The synthetic latex used in the present invention can be obtained by emulsion polymerization of the above radical polymerizable monomer in a conventional manner. The latexes having the average particle size in the above-mentioned range are generally known and those known latexes can be used as they are, or according to necessity, diluted with water or another organic solvent, preferably a water-miscible organic solvent, for use as a dispersion sealed in the transparent cell.

As an example of latex, latex and the like described in JP 2009-144101 A, JP 2008-101121 A, JP 2007-84777 A, JP 2003-268018 A, JP 2003-252667 A, JP 2002-226668 A, JP 2002-97214 A or the like can be included, and among these latexes, latexes having an average particle size of dispersed fine particle of 100 nm or more and 1.5 μm or less may be used.

The polymerization degree of polymer fine particles dispersed in these latexes is not particularly limited. It is usually, based on the number average molecular weight, 5,000 or more and 1,000,000 or less and preferably about 50,000 or more 300,000 or less.

Preferable latex can include acryl latex where acryl polymer fine particles are colloidally dispersed or styrene polymeric latex where styrene polymer fine particles are colloidally dispersed.

The acryl latex can include acryl latex obtained by emulsion polymerization of at least one kind of acryl monomer selected from the group consisting of the above acryl monomers, acryl latex obtained by emulsion polymerization of at least one kind of acryl monomer selected from the group consisting of the above-mentioned acryl monomers and at least one kind of monomer selected from the group consisting of the monomers listed as a preferable monomer copolymerizable therewith other than the above acryl monomer, and the like. Acryl latex obtained by emulsion polymerization of usually 1 to 4 kinds of acryl monomers is preferable.

When the above-mentioned acryl polymer is a copolymer, it can include acryl copolymer fine particles where at least one kind of acryl monomer component selected from the group consisting of the above-mentioned acryl monomers is an acryl monomer component (which is, however, at least two kinds of acryl monomer components selected from the group consisting of the above-mentioned acryl monomers when the acryl monomer component is 100% by mol, as is the same hereinafter) of 20 to 100% by mol and preferably 25 to 100% by mol to the whole copolymer and at least one kind of monomer component selected from the group consisting of monomers as other preferable monomers copolymerizable therewith is 0 to 80% by mol and preferably 0 to 75% by mol.

These acryl latexes are generally known and also described in the above JP 2007-84777 A, JP 2003-268018 A, JP 2003-252667 A, JP 2002-226668 A or the like. In addition, they are also commercially available and can be the acryl latex for filling in the transparent cell as they are, or appropriately after being diluted in the above-mentioned concentration range.

For example, the commercially available acryl latex (which is also referred to as acryl emulsion) includes Boncoat® (hereinafter, superscript "RTM" stands for "registered trademark") or Watersol® manufactured by DIC Corporation, Acryset® or U-Double® manufactured by Nippon Shokubai Co., Ltd., Polysol® manufactured by Showa Polymer Co., Ltd., Primal® manufactured by Nippon acryl Co., Ltd., Acronal manufactured by BASF Dispersion co., Ltd., Polytron® and Polydurex® manufactured by Asahi Chemical Industry Co., Ltd., UCAR™ Latex 120 or UCAR™ Latex 9037 manufactured by The Dow Chemical Company, and the like.

The styrene polymeric latex can include styrene polymeric latex obtained by emulsion polymerization of at least one kind of the above styrene compound monomers, styrene polymeric latex obtained by emulsion polymerization of at least one kind of the above styrene compound monomers and at least one kind of vinyl monomers copolymerizable therewith other than a styrene compound monomer, and the like.

When the above-mentioned styrene polymer is a copolymer, it is preferable a styrene polymer where the styrene compound monomer component (provided that, at least two kinds of monomer components selected from the group consisting of the above-mentioned styrene compound monomers when the styrene compound monomer component is 100% by mol, as is the same hereinafter) is 20 to 100% by mol and more preferably 25 to 100% by mol to the whole copolymer, and at least one kind of monomer component from vinyl monomers copolymerizable therewith other than the above styrene compound monomer is 0 to 80% by mol and more preferably 0 to 75% by mol.

The styrene polymeric latex is particularly preferably polystyrene latex obtained by single polymerization of styrene or by polymerization of styrene and butadiene.

The polystyrene latex is commercially available as products having a different particle size and concentration, and therefore they can be the acryl latex for filling in the transparent cell as they are, or appropriately after being diluted in the above-mentioned concentration range. For example, the commercially available polystyrene latex includes Nipol® LX407BP series (modified SB: Particle size of 200 to 400) manufactured by Zeon Corporation, polystyrene Latex microsphere, 0.2 micron manufactured by AlfaAesar, and the like.

The dispersion viscosity of latex fine particles is preferably 0.1 mPa·s or more and 10000 mPa·s or less and more preferably 0.1 mPa·s or more and 5000 mPa·s or less. In addition, it is further preferably 0.1 mPa·s or more and 1000 mPa·s or less. The further preferable viscosity is as mentioned in the section for the above dispersion viscosity. A lower the viscosity leads to a faster Brownian motion.

In the present invention, the latex fine particles are dispersed in a stably colloidal state usually in water or in a mixed liquid of a water-miscible organic solvent and water. The concentration of the latex fine particles in a dispersion sealed in the transparent cell is preferably such that said dispersed fine particles are colloidally, stably dispersed, speckle noise is sufficiently removed and the transmission amount of the laser light is as much as possible.

These vary depending on the kind of latex and also the intensity of scattering and diffusion varies depending on the relative relation between the refractive indexes of the medium and the latex fine particles, whereby it is difficult to determine the concentration as a rule. In general, said concentration may be in the concentration range of the above dispersed fine particles and is from 0.01% by weight to about 70% by weight, preferably in the range of 0.05% by weight to 60% by weight and more preferably 0.1% by weight to 30% by weight. The further preferable concentration of latex fine particles is 0.2% by weight or more and 10% by weight or less, and most preferable is 0.2% by weight or more and 5% by weight or less.

In addition, the fine particle dispersion used in the present invention may contain, if desired, a surfactant in the dispersion for dispersion stability of the fine particles. The surfactant is 0 to 10% by weight and preferably about 0 to 5% by weight to the weight of dispersed fine particles.

Further, by adding an organic solvent (preferably, organic solvent miscible with a fine particle dispersion) or a solute soluble in latex water dispersion other than said organic solvent (which is hereinafter referred to a soluble solute) to a fine particle dispersion, preferably latex water dispersion, used in the present invention, the light diffusivity can be controlled.

As said organic solvent, any solvent can be used as long as the dispersion becomes a homogeneous system. The main purpose of adding an organic solvent is to control the refractive index of the medium. The organic solvent which can be used includes alcohols such as methanol, ethanol, propanol and isopropanol (preferably, C1-C7 alcohol and more preferably C2-C4 alcohol); ketones such as acetone; a base-type solvent such as benzylamine, triethylamine and pyridine; an amide-type solvent such as N,N'-dimethylformamide, N,N'-dimethylacetoamide and N-methyl-2-pyrrolidone or a solvent containing nitrogen; and glycols such as ethylene glycol and propylene glycol.

These organic solvents are preferably ones which cannot impair the colloid stability, and usually a solvent miscible with water is preferable. For example, C2-C4 alcohol, acetone or the like is preferable. These solvents can be used as a diluent for latex.

The addition amount of these solvents is about 0 to 98% by weight to the total amount of the dispersion filled in the transparent cell.

As the above soluble solute other than an organic solvent, any compound can be used as long as it is soluble in a fine particle dispersion. The main purpose of adding a soluble substance is to control the refractive index of the medium. A larger addition amount can lead to a larger refractive index of the medium. The soluble substance which can be used includes an inorganic salt such as potassium sulfate, potassium chloride, magnesium chloride, sodium phosphate, potassium phosphate, sodium carbonate, calcium chloride, sodium sulfate, ammonium sulfate and sodium chloride, and a water-soluble organic compound such as water-soluble alcohol, organic acid, ketone, amine, nitroalkane, ether, aldehyde or cyclic ether which do not belong to the above organic solvents, particularly water-soluble saccharides such as sucrose, lactose and maltose. For the addition amount of the soluble substance, there is no problem when the values of the viscosity of the dispersion, the concentration of the dispersed fine particles and the like after the addition are in the preferable range, and any amount can be added to the extent that it can be dissolved.

Usually, these soluble substances are about 0 to 50% by weight and preferably about 0 to 30% by weight to the total amount of the dispersion filled in the transparent cell.

By a method of adding an organic solvent or a soluble substance to a latex water dispersion, material design of latex, or the like, the light diffusivity can be controlled by changing the refractive index balance of the particles and the medium in the colloid dispersion. Specifically, the light amounts of forward scattering and backward scattering can be controlled. When used in an image display device, the light amount of forward scattering is preferably larger in order to pass through optical paths arranged in order in a light device. In a preferable aspect of the present invention, a reflection mechanism is provided on the laser light incident side of the transparent cell, where backward scattering light can be also reused by reflecting toward the emission side of laser light with the reflection mechanism, resulting in that the whole light transmittance rate can be increased even though backward scattering light is somewhat more.

The forward scattering coefficient (which is calculated from the formula (1) described in the paragraph of evaluation of forward scattering coefficient described later) in light diffusion cell of the present invention is usually preferably higher, while in a preferable aspect of the present invention, the range of about 1 to 1.5 and more preferably ranging about 1.05 to 1.3 is sufficiently available because the backward scattering light can be also used by the reflection mechanism as mentioned above.

The fine particle dispersion in the present invention is preferably one having a higher use efficiency (light utilization rate) of the laser light emitted from the laser light source. The light utilization rate of the fine particle dispersion can be, as shown in Examples described later, calculated from the later-described formula (2) after replacing an empty transparent cell on a mirror, emitting strobe light of a color difference meter onto the transparent cell, measuring the light amount passed through the transparent cell and reflected as reflectivity with a color difference meter, then filling the fine particle dispersion in said transparent cell and similarly measuring the reflectivity. The preferable light utilization rate range of this fine particle dispersion is about 50 to 95%, preferably about 60 to 95% and more preferably about 70 to 95%. The most practical is about 80 to 90%.

The higher this light utilization rate is, the better, but it is preferable to control the light utilization rate in the above-mentioned range by dispersion concentration of the above fine particle because a too low concentration of the dispersion fine particles for increasing the light utilization rate may lead to insufficient removal of speckle noise.

The viscosity of the inorganic fine particle dispersion in the present invention is preferably 0.15 mPa·s or more and 10000 mPa·s or less and more preferably 0.15 mPa·s or more and 5000 mPa·s or more. In addition, it is further preferably 0.15 mPa·s or more and 1000 mPa·s or less. The further preferable dispersion viscosity is as described above. The inorganic fine particles are preferably aluminum oxide fine particles, and as well as the latex dispersion, a lower viscosity thereof leads to a faster Brownian motion. The aluminum oxide fine particle dispersion used in the present invention is known as aluminasol and the like, and commercial products thereof can be used. The commercial products can include Cataloid® AS-3 manufactured by Catalysts & Chemicals Ind. Co., Ltd., and the like.

The preferable dispersions sealed in the light diffusion cell for laser light of the present invention are summarized as follows. "%" means "% by weight", which represents a rate relative to the whole dispersion.

(i) A fine particle dispersion, wherein fine particles having an average particle size of 100 nm or more and 1.5 µm or less are contained at concentration of 0.1% to 30% to the whole liquid dispersion medium and the viscosity is 0.1 mPa·s or more and 1000 mPa·s or less.

(ii) The fine particle dispersion according to the above (i), wherein the liquid dispersion medium is water or a mixed liquid of a water-miscible organic solvent and water, the content of water is 2% to 100% to the total amount of the liquid dispersion medium and the rest is a water-miscible organic solvent.
(iii) The fine particle dispersion according to the above (i) or (ii), wherein the water-miscible organic solvent is acetone.
(iv) The fine particle dispersion according to the above (i) or (ii), wherein the liquid dispersion medium is water.
(v) The fine particle dispersion according to any one of the above (i) to (iv), which is latex or an inorganic fine particle dispersion.
(vi) The fine particle dispersion according to the above (v), wherein the latex is acryl latex or styrene latex.
(vii) The fine particle dispersion according to the above (v), wherein the inorganic fine particles are aluminum oxide fine particles.
(viii) The fine particle dispersion according to any one of the above (i) to (vii), wherein a water-soluble saccharide is also contained at a concentration of 1 to 50% to the total amount of fine particle dispersion.
(ix) The fine particle dispersion according to the above (viii), wherein the water-soluble saccharide is at least one kind selected from the group consisting of sucrose, lactose and maltose.
(x) The fine particle dispersion according to any one of the above (i) to (vii), wherein the average particle size of the dispersed fine particles is 150 nm to 500 nm and more preferably 180 nm to 300 nm.
(xi) The fine particle dispersion according to any one of the above (i) to (x), wherein the fine particle content of the fine particle dispersion is 0.2% to 10% to the total amount of fine particle dispersion.
(xii) The fine particle dispersion according to any one of the above (i) to (xi), wherein the viscosity of the fine particle dispersion is 0.5 mPa·s or more and 500 mPa·s or less.
(xiii) The fine particle dispersion according to any one of the above (i) to (xii), wherein the viscosity of the fine particle dispersion is 1 mPa·s or more and 10 mPa·s or less.
(xiv) The fine particle dispersion according to any one of the above (i) to (xii), wherein the light utilization rate of the fine particle dispersion in the state of being filled in the above transparent cell is 60 to 95%.

The transparent cell used in the present invention has, preferably, at least two opposing substrates (more specifically, a pair of parallel, flat walls perpendicularly facing the traveling direction of laser light) and a space inside of which a dispersion used in the present invention can be sealed, and thus has a structure which can seal the margin of the parallel wall. The internal distance between a pair of flat walls (distance where a dispersion can be sealed, which is also referred to as internal thickness, hereinafter) varies depending on the kinds of dispersion fine particles, the concentration, the liquid medium used and the like and cannot be generally suggested, but it is preferably as thin as possible in terms of the increased amount of transmitting laser light. In terms of easy production, usually, it is preferably about 0.1 mm or more and 5 mm or less. It is more preferably about 0.1 mm or more and 4 mm or less and further preferably about 0.1 mm or more and 3 mm or less.

In addition, the size of the transparent cell may be adjusted to the light source, and the like, and usually, the light-transmitting part of the above-mentioned flat walls is about 0.04 $cm^2$ to 100 $cm^2$ and preferably about 0.2 $cm^2$ to 100 $cm^2$. The thickness of the above-mentioned parallel wall (substrate) of the transparent cell may be such that the strength of the container can be retained and it is not particularly limited. It is usually about 0.05 mm to 5 mm, more preferably about 0.1 mm to 2 mm and further preferably about 0.1 mm to 1 mm.

The form of said transparent cell is not particularly limited and it can be an optional form in accordance with the laser light source or the image display device where said transparent cell is placed. It is most ordinary a 4 to 8 prism type, a circular cylinder type or the like.

The material of the transparent cell (particularly, the material of the above-mentioned pair of parallel flat walls (substrate)) used in the present invention includes a colorless and transparent inorganic substrate and a colorless and transparent plastic substrate. In any case, it is preferably one having no absorption at the wavelength of laser light from a laser light source. As an inorganic substrate thereof, for example, a glass substrate, a quartz substrate, a sapphire substrate and the like has a highly transparency and is suitably used. The plastic substrate can include, for example, a substrate using a material such as acryl resin such as polymethacrylic acid methyl, polycarbonate, polystyrene, polyethylene terephthalate, polybutylene terephthalate, polyethylene naphthalate, MS resin, polyvinyl alcohol, cellulose resin such as triacetyl cellulose, cycloolefin-type resin such as norbornene or modified norbornene, fluorine-type resin, polyallylate, polyether sulfone, cyclohexadiene-type polymer, acrylonitrile styrene (AS) resin, polyamide, polyimide, polyacetal, polyester, polyurethane, polyethylene, polypropylene, polyvinyl chloride, polyvinylidene chloride, epoxy resin, ABS resin, fluorene-type resin, silicone-type resin, organic or inorganic hybrid resin, polylactic acid (PLA) resin and thermoplastic elastomer, and one having no absorption at the wavelength of the laser light used for a light source can be suitably used.

The important features of the image display device are that image visibility is good, light emitting from a light source is used without attenuation, the screen is sufficiently bright and images are easy to see. In addition, while energy conservation activities have been recently recommended, low power consumption in image display devices is one of the most important themes for set/panel manufacturers, as well as improvement of image quality and function. In these terms, improvement of light use efficiency in a laser light source is important. For the reason, a higher whole light transmittance rate of laser light of the substrate of the light diffusion cell of the present invention is better, and it preferably has a whole light transmittance rate of 80% or more, more preferably 85% or more and further preferably a transmittance of 90% or more. The upper limit is 100%, but actually about 99% because of about 1% inevitable absorption and the whole light transmittance rate of laser light of the most preferable substrate is about 90 to 99%.

The light diffusion cell for laser light of the present invention contains the above fine particle dispersion, preferably the fine particle dispersion according to any one of the above (i) to (xiii), inside a transparent cell mentioned above (preferably a transparent cell having a whole light transmittance rate of laser light of 80% or more).

The forward scattering coefficient F (which is calculated from the formula (1) described later) in said light diffusion cell is preferably larger than 1. Usually, in the light diffusion cell of the present invention, said forward scattering coefficient F is, as described above, larger than 1 and about 1.5 or less.

In addition, the emission light amount relative to the incident light amount of laser light in said light diffusion cell is about 40% or more and 90% or less, and can be increased to about 50% or more and 95% or less by providing the later-described reflection mechanism.

Figure 2:
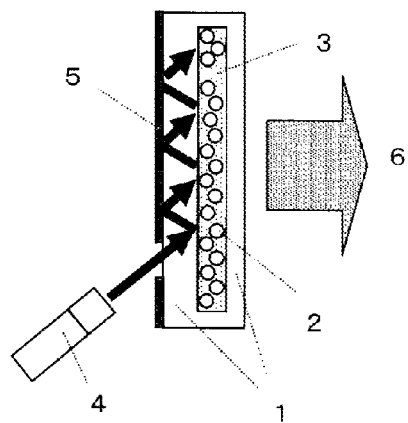
FIG. 2 is a sectional drawing showing one example of the embodiments of the light source device of the present invention having the semiconductor laser light source and the light diffusion cell for laser light with a reflection mechanism of the present invention.

In a preferable aspect of the light diffusion cell and the light source device of the present invention, a reflection mechanism is provided neighboring to the laser light incident side of said light diffusion cell. The reflection mechanism reflects backward scattering light among the light incident on the light diffusion cell of the present invention and guides it to the emission side, thus having a function of improving light use efficiency. The reflection mechanism is not particularly limited as long as having the above-mentioned function. Usually, they can include placement of a reflecting plate or a film for reflecting, coating for reflecting (including vapor-deposition) or the like. For placement of a reflecting plate or a film for reflecting, it may be placed on the substrate face of the laser light incident side of the light diffusion cell of the present invention by adhesion or another conventional method, for example, as shown in FIG. 1 or FIG. 2. In addition, the coating for reflecting can include coating on any face of the substrate of the laser light incident side of the light diffusion cell of the present invention.

As the reflecting plate or film for reflecting, any can be used as long as it is a reflecting plate or a reflecting film which can totally reflect the wavelength of the laser light used, such as film or plate where white pigment is mixed in the resin, white-painted or white-printed aluminum plate, metal plate having a mirror plane, foil of a metal such as aluminum, film or plate with a metal such as aluminum or silver deposited thereon, or the like.

In addition, the coating for reflecting can include white-painting (including printing), metal vapor-deposition or the like. The higher the reflectivity of the reflection mechanism is, the more preferable. For example, said reflectivity is preferably 60% or more, more preferably 75% or more and further preferably 90% or more. The upper limit is 100%, but usually about 95 to 98%.

The light source device of the present invention is comprised of the light diffusion cell for laser light and the laser light source of the present invention described above. The light diffusion cell for laser light of the present invention used in the laser light source device of the present invention is preferably a light diffusion cell for laser light containing a fine particle dispersion described in any one of the above (i) to (xiii), and in a further preferably aspect, said light diffusion cell has the above reflection mechanism.

The laser light source used in the light source device of the present invention is not particularly limited and any laser light source can be used. For example, any of a red laser light source, a blue laser light source, a green laser light source or the like can be used. Any of these light sources is commercially available and can be obtained from the market.

The image display device using the light diffusion cell or the light source device of the present invention includes a projection-type image display device. In this type of image display device, a projection lamp (laser light projection lamp in the present invention) is a light source, a small display is used for light switching, and images are displayed by projecting light which is amplified in a final size. The light source device of the present invention is used as the light source. In addition, when the light diffusion cell of the present invention is used, it may be appropriately placed in the laser light passage between said projection lamp and an image-magnifying lens. For the front projector amplifying and projecting images in an image display device of said projection type, application at home such as home theater and business application such as presentation have been in the mainstream, but recently as a mobile multimedia broadcasting service such as digital multimedia broadcasting (DMB) is provided, a portable small projection image display device is also required. Such a small projection image display device is considered to play a role of expanding its application of the front projector in the future. The light source device of the present invention can be also used in such a small front projector.

In addition, the rear projection-type image display device such as projection TV follows the basic structure of the front projection-type, but it differs in that screen images are projected on an internal screen by folding and bending, through a mirror, optical path emitted from a light source. The front projection-type display device requires a wide space to the screen, while the rear projection type allows screen images to be seen even not in the dark and does not require a waste space in front of the screen. The light diffusion cell or the light source device of the present invention can be also used in such a rear projection-type image display device.

The laser light source is excellent in color reproductivity compared with a display technique using other light sources, leading to improvement of imaging properties and therefore it is expected to be applied not only to projectors but also to other devices. As an example, there is an attempt that laser light of a point light source is converted into a surface light source and used as a backlight. The light diffusion cell for laser light of the present invention and a laser light source device using it have both speckle removing effect and a function of converting a point light source into a surface light source by diffusion, whereby it can be used for an edge light-type backlight using laser light shown in FIG. 3, allowing design of an image display device such as a compact-size liquid crystal display exhibiting a high color purity.

In addition, by using a semiconductor laser light source, it is also possible to display by the field sequential type where light emission line of monochrome light is used to change display color at a high speed and color filter is not required. The light diffusion cell for laser light of the present invention or the laser light source device of the present invention using said light diffusion cell can be used in such a field sequential-type image display device. By using said light diffusion cell or the laser light source device of the present invention using said diffusion cell together with a semiconductor laser light source, it is possible to constantly remove speckle in each color without a mechanical driving part and to easily realize a field sequential-type image display device using laser light. The image display device has no limit to the structure of its light valve and optical system and includes, for example, a transmission-type liquid crystal display and a semi-transmission-type liquid crystal display device.

Therefore, the image display device of the present invention includes all of the image display devices comprising a laser light source and the light diffusion cell for laser light of the present invention or the image display devices comprising the laser light source device of the present invention, regardless of the type of image display device.

The light diffusion cell for laser light of the present invention or the laser light source device of the present invention has a function of emitting incoherent laser light. When essentially coherent semiconductor laser light passes through the light diffusion cell for laser light of the present invention where a fine particle dispersion having a particular average particle size is sealed, it receives fluctuation effect of the coherence length or longer by dynamic light scattering from Brownian motion to lose original high coherence and be converted into incoherent light. As a result, speckle noise does not appear.

Figure 3:
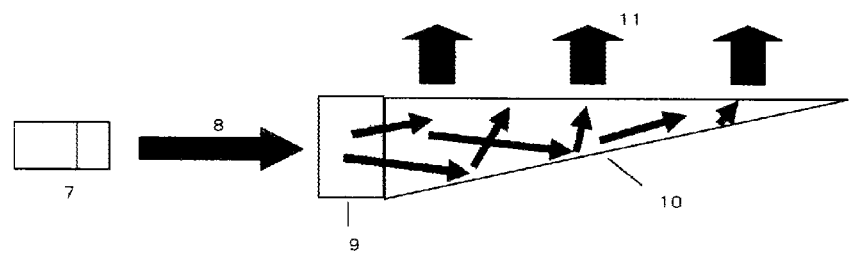
FIG. 3 is a configuration diagram of an edge light-type surface light source utilizing semiconductor laser light, which comprises the light diffusion cell for laser light of the present invention.

The light diffusion cell for laser light of the present invention may be placed, as shown in FIG. 3, near the emission opening of laser light of a semiconductor laser oscillator (laser light source) to immediately change the emitted light into incoherent light, or it may be placed in the middle of the laser light passage to projection, which is far from the emission opening of laser light, to change into incoherent light at any position before projection.

In addition, the image display device of the present invention may have, according to necessity, a lens for refocusing diffusion light and other optical components on the laser light passage. Additional optical components vary depending on the image display device, and for example in the case of the projection type, it is preferred that a lens for refocusing diffusion light is comprised so that diffusion light is focused before passing through each optical system. Further, when laser light is used for backlight in a liquid crystal display, it is preferred that an optical component is comprised to uniformly scatter diffusing light from a laser light source all over the backlight.

EXAMPLES

The content of the present invention will be specifically explained using the following Examples, but the present invention is not limited to them. In this regard, "%" used in the following Examples is, unless otherwise specifically noted, based on "% by weight"

Example 1

(1) A latex water dispersion (Polystyrene Latex Microsphere, 1 micron, manufactured by AlfaAesar) having an average polymer particle size of 1000 nm (which was measured using Microtrac Ultrafine Particle Analyzer (W) UPA-150 from Nikkiso Co., Ltd., as is the same hereinafter) and a solid content (polymer fine particle content) of 2.5% by weight was diluted with water to give a solid content of 0.2% by weight and mixed by shaking to uniformly disperse in order to make a dispersion for evaluation. The viscosity of this dispersion for evaluation was 2.6 mPa·s (25° C.). (The viscosity was measured by VISCOMETER TVB-10 from Tokisangyo Co., Ltd., as is the same hereinafter.) This dispersion for evaluation was filled in a cell having an internal thickness of 2 mm (an external thickness of 4 mm, a longitudinal of 30 mm and a width of 30 mm) (a capacity of 1.8 mL) and made of glass having a whole light transmittance rate of 91% to make a light diffusion cell for laser light of the present invention (without a reflection mechanism).

(2) As for the reflection mechanism, a round hole having a diameter of 3 mm for incident opening was made in an aluminum vapor-deposited PET film as shown in FIG. 2 and the film was adhered to the back surface of the light diffusion cell obtained in the above-mentioned (1) to obtain a light diffusion cell for laser light of the present invention comprising a reflection mechanism. Using this light diffusion cell, presence or absence of speckle noise was evaluated by the following evaluation methods 1 and 2. In addition, forward scattering coefficient and light utilization rate were evaluated using the diffusion cell for laser light before providing the reflection mechanism. The results are shown in Table 1.

(1) Evaluation Method for Speckle Noise

Evaluation Method 1

Using a green laser pointer for presentation driven by dry-cell battery as a semiconductor laser oscillator, laser light having an output power of 1 mW was emitted, as shown in FIG. 2, to the light diffusion cell for laser light comprising the reflection mechanism made as mentioned above, and diffusion light obtained by passing through said diffusion cell was projected on the screen made of white paper which was 15 cm far from said diffusion cell in a darkroom. Presence or absence of speckle noise in the projected light was observed at that time.

Speckle noise appeared as a flickering of the diffusion light projected and a lot of flickering was observed in the projected light not passing through the diffusion cell. So, reduction effect of speckle noise was evaluated by comparison with it. The evaluation criteria are as follows.

Evaluation Criteria:

◯: Flickering of projected light is not almost observed.

Δ: Flickering is observed but nearly half or less compared with the case of not transmitting through the light diffusion cell for laser light.

X: A lot of flickering is observed in the same degree as in the case of not transmitting through the diffusion cell.

Evaluation Method 2

Using a green laser pointer for presentation driven by dry-cell battery as a semiconductor laser oscillator, diffusion light produced by passing this light through the diffusion cell of the present invention was incident into the integrating sphere where the inside thereof had been coated with barium sulfate, and the projected light reflected on the inside wall of the integrating sphere was observed. The evaluation criteria are the same as in the case of the above-mentioned evaluation method 1.

(2) Evaluation of Forward Scattering Coefficient

As evaluation of light diffusivity, specifically forward scattering ability, forward scattering coefficient was evaluated.

Calculation Method of Forward Scattering Coefficient F:

Using a color difference meter (manufactured by Konica Minolta Co., Ltd.), a light diffusion cell for laser light not having a reflection mechanism was placed on a specular reflection plate (mirror), strobe light for color measurement was irradiated on said cell surface from the front, and L* (CIE-1976 L*a*b* color system, by JIS Z 8729) value (Lb) was measured. Similarly, L* value (Ld) in the case of placing the light diffusion cell for laser light not having a reflection mechanism on a light absorption body (black felt cloth) was measured. Then, forward scattering coefficient F was calculated from the following formula (1). Lb shows the degree of forward scattering, and a higher value of this leads to a larger forward scattering. In addition, Ld shows the degree of backward scattering, and a larger value of this leads to a larger backward scattering. Therefore, a larger value of the forward scattering coefficient F results in a larger rate of the forward scattering component.

$$F = Lb/Ld \qquad \text{Formula (1)}$$

(3) Evaluation of Light Utilization Rate

The total of the transmitted light and the diffusion light of the light diffusion cell for laser light not having a reflection mechanism was evaluated as light utilization rate.

Calculation Method of Light Utilization Rate (X):

Using a color difference meter (manufactured by Konica Minolta Co., Ltd.), the light diffusion cell for laser light not having an empty reflection mechanism not filled with a fine particle dispersion inside thereof was placed on the specular reflection plate (mirror), and strobe light for color measurement was irradiated on said cell surface from the front to measure the reflectivity Y (Ya) in Yxy display system. Because the specular reflection plate was placed, it is meant that the total of transmitted light and diffused light was measured. Similarly, the reflectivity Y (Yb) of the light diffusion cell for laser light filled with a fine particle dispersion inside thereof was measured and calculated from the following formula (2). X shows the degree of using light incident on the light diffusion cell for laser light as emission light, and a larger value of this leads to a larger use efficiency of light.

$$X = Yb/Ya \times 100 \qquad \text{Formula (2)}$$

Example 2

A light diffusion cell was made in the same operation as in Example 1 except that a latex water dispersion having an average polymer particle size of 200 nm and a solid content (polymer fine particle content) of 2.5% by weight (manufactured by AlfaAesar, polystyrene Latex microsphere, 0.2 micron) was diluted with water to give a solid content of 0.6% by weight. This cell was evaluated in the same manner as in Example 1. The results are shown in Table 1.

In this regard, the viscosity of this latex water dispersion diluted to a solid content (polymer fine particle content) of 0.6% by weight was 1.4 mPa·s (25° C.).

Example 3

A light diffusion cell was made in the same operation as in Example 1 except that a latex water dispersion having an average polymer particle size of 200 nm and a solid content (polymer fine particle content) of 2.5% by weight (manufactured by AlfaAesar, polystyrene Latex microsphere, 0.2 micron) was diluted with a 25% saccharide solution to give a solid content of 0.6% by weight. This cell was evaluated in the same manner as in Example 1. The results are shown in Table 1.

In this regard, the viscosity of this latex water dispersion diluted to a solid content (polymer fine particle content) of 0.6% by weight was 3.9 mPa·s (25° C.).

Example 4

A light diffusion cell was made in the same operation as in Example 1 except for using a dispersion where an aluminum oxide water dispersion having an average particle size of aluminum oxide of 100 nm and a solid content (aluminum fine particle content) of 7% by weight (manufactured by Catalysts & Chemicals Ind. Co., Ltd., aluminasol, Cataloid® AS-3) and diluted with water to give a solid content (aluminum fine particle content) of 4% by weight. This cell was evaluated in the same manner as in Example 1. The results are shown in Table 1.

In this regard, the viscosity of this aluminum water dispersion having an aluminum fine particle content of about 4% by weight was 4.0 mPa·s (25° C.).

Comparative Example 1

In a flask, 0.4 g of gellan gum (manufactured by Junsei Chemical Co., Ltd.) and 80 g of deionized water were placed and dissolved while raising the temperature to 95° C. with a hot stirrer. This gellan gum solution was cooled to 80° C. and 0.05 g of calcium chloride were added to obtain a colorless and transparent solution. This solution was to be used as a diluent and gelation liquid. A latex water dispersion (manufactured by AlfaAesar, polystyrene Latex microsphere, 1 micron) having an average particle polymer size of 1000 nm and a solid content (polymer fine particle content) of 2.5% by weight was diluted with the above-mentioned diluent and gelation liquid of 80° C. to give a solid content (polymer fine particle content) of 0.2%, mixed by shaking for uniformly dispersion, and filled in a cell having an internal thickness of 2 mm and made of glass. Using an aluminum vapor-deposited PET film as a reflection mechanism, a light diffusion cell for laser light with a reflection mechanism was made in the same manner as in Example 1. As it was left at room temperature, the dispersion in the cell became a gelated body where colloidal particles were encapsulated. This cell was evaluated for speckle noise, forward scattering coefficient and light utilization rate in the same manner as in Example 1. The results are shown in Table 1.

Comparative Example 2

A light diffusion cell was made in the same operation as in Example 1 except for using a latex water dispersion having an average polymer particle size of 50 nm and a solid content (polymer fine particle content) of 2.5% by weight (manufactured by AlfaAesar, polystyrene Latex microsphere, 0.05 micron) as it is without dilution. This cell was evaluated for speckle noise, forward scattering coefficient and light utilization in the same manner as in Example 1. The results are shown in Table 1.

In this regard, the viscosity of this latex water dispersion having a solid content (polymer fine particle content) of 2.5% by weight was 2.1 mPa·s (25° C.).

Comparative Example 3

A light diffusion cell for laser light for comparison was made in the same manner as in Example 1 except for using a dispersion (dispersion viscosity of 2.9 mPa·s, 25° C.) where water had been added to acryl polymer fine particles (manufactured by Soken Chemical & Engineering Co., Ltd., MX-300) having an average particle size of 3 μm to give a solid content (polymer fine particle content) of 2% by weight. This cell was evaluated for speckle noise, forward scattering coefficient and light utilization rate in the same manner as in Example 1. The results are shown in Table 1.

This dispersion system was not a stable colloid dispersion and the fine particles were sedimented after still standing for 10 minutes, whereby as seen from Table 1, it is found to have no reduction effect on speckle noise and to be unpreferable.

TABLE 1

|  | Example 1 | Example 2 | Example 3 | Example 4 | Comp. Ex. 1 | Comp. Ex. 2 | Comp. Ex. 3 |
|---|---|---|---|---|---|---|---|
| Noise evaluation method 1 | ○ | ○ | ○ | ○ | X | X | X |
| Noise evaluation method 2 | ○ | ○ | ○ | ○ | X | Δ | X |
| Forward scattering coefficient F (—) | 1.20 | 1.06 | 1.07 | 1.15 | 1.20 | 1.88 | 1.22 |
| Light utilization × (%) | 60 | 87 | 83 | 64 | 56 | 74 | 56 |
| Viscosity (m · Pa) | 2.6 | 1.4 | 3.9 | 4.0 | — | 2.1 | 2.9 |
| Particle size | 1000 nm | 200 nm | 200 nm | 100 nm | 1000 nm | 50 nm | 3 μm |
| Remarks |  |  | Addition of sucrose | Al. oxide fine particle | Gelled solute | Small particle | Large particle |

Comp. Ex.: Comparative Example.

Example 5

(1) An acryl latex water dispersion having an average polymer particle size of 220 nm and a solid content (polymer fine particle content) of about 31% by weight was diluted with water to give a solid content (polymer fine particle content) of 0.6% by weight and mixed uniformly by shaking for dispersion to give a dispersion for evaluation. The viscosity of this dispersion for evaluation was 3.1 mPa·s (25° C.). This dispersion for evaluation was filled into a quadrangular cell having an internal thickness of 2 mm (an external thickness of 4 mm, a longitudinal of 30 mm and a width of 30 mm) (a capacity of 1.8 ml) and made of colorless and transparent glass, to make a light diffusion cell for laser light of the present invention (without a reflection mechanism).

(2) As for the reflection mechanism, a round hole having a diameter of 3 mm for incident opening was made in an aluminum vapor-deposited PET film as shown in FIG. 2 and the film was adhered to the back surface of the light diffusion cell obtained in the above-mentioned (1) to obtain a light diffusion cell for laser light of the present invention comprising a reflection mechanism. Using this light diffusion cell comprising a reflection mechanism, presence or absence of speckle noise was evaluated by the speckle noise evaluation methods 1 and 2 in Example 1.

In addition, forward scattering coefficient was evaluated using the light diffusion cell for laser light (without a reflection mechanism) before providing the reflection mechanism in the same manner as in Example 1 except for using the cell in the above-mentioned (1). The results are shown in Table 2.

Example 6

A light diffusion cell comprising for laser light of the present invention (without a reflection mechanism) and a light diffusion cell comprising a reflection mechanism ware made in the same operation as in Example 5 except that an acryl latex water dispersion having an average polymer particle size of 220 nm and a solid content (polymer fine particle content) of about 31% by weight was diluted with acetone to give a solid content (polymer fine particle content) of about 0.6% by weight. This cell was evaluated in the same manner as in Example 5. The results are shown in Table 2.

In this regard, the viscosity of this acryl latex water dispersion diluted to give a solid content (polymer fine particle content) of about 0.6% by weight was 1.3 mPa·s (25° C.).

Example 7

A light diffusion cell comprising for laser light of the present invention (without a reflection mechanism) and a light diffusion cell comprising a reflection mechanism were made in the same operation as in Example 5 except that an acryl latex water dispersion having an average particle size of 120 nm and a solid content (polymer fine particle content) of about 42% by weight was diluted with water to give a solid content (polymer fine particle content) of about 2% by weight. This cell was evaluated in the same manner as in Example 5. The results are shown in Table 2.

In this regard, the viscosity of this acryl latex water dispersion diluted to give a solid content (polymer fine particle content) of about 2% by weight was 3.6 mPa·s (25° C.).

Example 8

A light diffusion cell for laser light of the present invention (without a reflection mechanism) and a light diffusion cell comprising a reflection mechanism were made in the same operation as in Example 5 except that an acryl latex water dispersion having an average polymer particle size of 120 nm and a solid content (polymer fine particle content) of about 42% by weight was diluted with 25% by weight of an aqueous sucrose solution to give a solid content (polymer fine particle content) of about 2% by weight (the viscosity of the dispersion after dilution was 5.8 mPa·s (25° C.)). This cell was evaluated in the same manner as in Example 5. The results are shown in Table 2.

Example 9

A light diffusion cell was made in the same operation as in Example 5 except that an aluminum oxide water dispersion having an average aluminum oxide particle size of 100 nm and a solid content (aluminum oxide fine particle content) of about 7% by weight (manufactured by Catalysts & Chemicals Ind. Co., Ltd., aluminasol, Cataloid® AS-3) was diluted with water to give a solid content (aluminum oxide fine particle content) of about 4% by weight. This cell was evaluated in the same manner as in Example 5. The results are shown in Table 2.

In this regard, the viscosity of this aluminum water dispersion having an aluminum fine particle content of about 4% by weight was 4.0 mPa·s (25° C.).

Comparative Example 4

In a flask, 0.4 g of gellan gum (manufactured by Junsei Chemical Co., Ltd.) and 80 g of deionized water were placed and dissolved while raising the temperature to 95° C. with a hot stirrer. This gellan gum solution was cooled to 80° C. and 0.05 g of calcium chloride was added to obtain a colorless and transparent solution. This solution was to be used as a diluent and gelation liquid. An acryl latex water dispersion having an average polymer particle size of 230 nm and a solid content (polymer fine particle content) of about 51% by weight was diluted with the above-mentioned diluent and gelation liquid of 80° C. to give a solid content (polymer fine particle content) of 1.275%, mixed by shaking for uniformly dispersion, and filled into a cell having an internal thickness of 2 mm and made of glass to make a light diffusion cell for laser light without a reflection mechanism. In addition, using an aluminum vapor-deposited PET film as a reflection mechanism, a light diffusion cell for laser light with a reflection mechanism was made in the same manner as in Example 5. As it was left at room temperature, the dispersion in the cell became a gelated body where colloidal particles were encapsulated. This cell was evaluated for speckle noise in the same manner as in Example 5. The results are shown in Table 2.

In this regard, this light diffusion cell for laser light had no reduction effect on speckle noise as seen from Table 2, and therefore other evaluations were omitted.

Comparative Example 5

A light diffusion cell for laser light with a reflection mechanism for comparison was made in the same manner as in Example 5 except for using an acryl latex water dispersion having an average polymer particle size of 85 nm and a solid content (polymer fine particle content) of 40% by weight as it is (dispersion viscosity of 2.9 mPa·s (25° C.)). Presence or absence of speckle noise was evaluated with this cell in the same manner as in Example 5. The results are shown in Table 2.

In this regard, this light diffusion cell for laser light had no reduction effect or insufficient reduction effect on speckle noise as seen from Table 2, and therefore other evaluations were omitted.

Comparative Example 6

A light diffusion cell for laser light for comparison was made in the same manner as in Example 5 except for using a dispersion (dispersion viscosity of 2.9 mPa·s, 25° C.) where water was added to acryl polymer fine particles (manufactured by Soken Chemical & Engineering Co., Ltd., MX-300) having an average particle size of 3 μm to give a solid content (polymer fine particle content) of about 2% by weight. This cell was evaluated for speckle noise in the same manner as in Example 5. The results are shown in Table 2.

In this regard, this light diffusion cell for laser light had no reduction effect on speckle noise as seen from Table 2, and therefore other evaluations were omitted.

In addition, this dispersion system was not a stable colloid dispersion and the fine particles were precipitated after still standing for 10 minutes, and therefore it is found to have no reduction effect on speckle noise and to be unpreferable in that term.

Example 10

The light diffusion cell for laser light with the reflection mechanism obtained in Example 1 of the present invention was placed on a laser light source, at the emission opening of said light source, in the arrangement shown in FIG. 2 to make a laser light source device of the present invention.

In addition, by placing the obtained laser light source device in stead of a light source of a conventional projector, a projector comprising a laser light source device of the present invention can be obtained.

INDUSTRIAL APPLICABILITY

The light diffusion cell for laser light of the present invention and the laser light source device comprising it can remove or significantly reduce speckle noise of projected images in an image display device using a laser light only by using said light diffusion cell or said laser light source device without a mechanically driving device or an electric oscillation-applying means for removing speckle noise and further they can be easily placed in any type of said image display device, and therefore, it is very useful for removing speckle noise in said image display device. In addition, said light

TABLE 2

| | Example 5 | Example 6 | Example 7 | Example 8 | Example 9 | Comp. Ex. 4 | Comp. Ex. 5 | Comp. Ex. 6 |
|---|---|---|---|---|---|---|---|---|
| Noise evaluation method 1 | ◯ | ◯ | ◯ | ◯ | ◯ | X | X | X |
| Noise evaluation method 2 | ◯ | ◯ | ◯ | ◯ | ◯ | X | Δ | X |
| Forward scattering coefficient | 1.08 | 1.13 | 1.10 | 1.18 | — | — | — | — |
| Particle size | 220 nm | 220 nm | 120 nm | 120 nm | 100 nm | 230 nm | 85 nm | 3 μm |
| Remarks | | Addition of solvent | | Addition of sucrose | Al. oxide fine particle | Gelled medium | | |

Comp. Ex.: Comparative Example.

The following are clear from the above-mentioned Table 1 and Table 2.
(1) Judging from Comparative Examples 1 and 4, fine particles dispersed in a gelated medium cannot reduce speckle noise even though they are particles having an average particle size in the range of 100 nm to 1.5 μm dispersed in a medium. It is considered that this is because Brownian motion of said fine particles is inhibited by the gelation medium.
(2) As in Comparative Examples 2, 3, 5 and 6, fine particles having a too small average particle size such as 50 nm or 85 nm or a too large average particle size such as 3 μm lead to no reduction or, if any, insufficient reduction of speckle noise, even though they are dispersed in water medium allowing Brownian motion. In addition, as in Comparative Examples 3 and 6, a large average particle size such as 3 μm leads to bad colloid stability and is not suitable for a light diffusion cell for laser light for reduction of speckle noise.
(3) From Examples 1 to 9, it is found that a dispersion where fine particles having an average particle size in the range of 100 nm to 1.5 μm are dispersed in a stable colloidal state is suitable for removing or significantly reducing speckle noise generated from laser light, and that a light diffusion cell for laser light where said dispersion was sealed is suitable for removing or significantly reducing speckle noise.

diffusion cell has a simple constitution, occupies a smaller volume and is easily produced, allowing cost minimization for removing speckle noise in said image display device. And the image display device (for example, front projector and rear projection type TV, liquid crystal display and the like) of the present invention comprising said light diffusion cell or said laser light source device of the present invention has no speckle noise and is excellent in color reproductivity and visibility.

DESCRIPTION OF SYMBOLS

1: Transparent cell;
2: Dispersed fine particles;
3: Liquid medium;
4: Laser oscillator;
5: Reflection mechanism;
6: Diffusion light (incoherent semiconductor laser light);
7: Laser oscillator;
8: Coherent semiconductor laser light;
9: Light diffusion cell for laser light of the present invention;
10: Light guide plate;
11: Diffusion light (incoherent light) emitted from a wider area by changing traveling direction with a light guide plate.

The invention claimed is:

1. A light diffusion cell for laser light, comprising a transparent cell in which liquid can be sealed, and a fine particle dispersion containing fine particles having a particle size of 120 nm or more and 500 nm or less in a concentration of 0.1% by weight or more and 25% by weight or less to the total amount of the dispersion and a liquid medium transmitting light and having a viscosity of 0.1 mPa·s or more and 10000 mPa·s or less at 25° C. sealed in said transparent cell.

2. The light diffusion cell for laser light according to claim 1, wherein the fine particle dispersion is latex or a dispersion of inorganic fine particles.

3. The light diffusion cell for laser light according to claim 2, wherein the dispersed fine particles in latex are acryl polymer fine particles or styrene polymer fine particles.

4. The light diffusion cell for laser light according to claim 2, wherein the inorganic particles are aluminum oxide fine particles.

5. The light diffusion cell for laser light according to claim 1, wherein the transparent cell has a whole light transmittance rate of 85% or more and is comprised of an inorganic material or a plastic material.

6. The light diffusion cell for laser light according to claim 1, wherein said laser light has an incident side and an emission side, said light diffusion cell further comprising a reflection mechanism on said incident side of said laser light to reflect backward scattering light from said light diffusion cell to said emission side of said laser light in the light diffusion cell for laser light.

7. The light diffusion cell for laser light according to claim 1 having a light utilization rate, wherein the light utilization rate in the fine particle dispersion when filled in the light diffusion cell for laser light is 70 to 95%.

8. A light source device comprised of the light diffusion cell for laser light according to any one of claims 1 to 7 and a semiconductor laser light source.

9. An image display device equipped with a light source device comprised of the light diffusion cell for laser light according to claim 6 and a semiconductor laser light source.

10. The image display device according to claim 9, which is a front projector or rear projection type display.

11. The image display device according to claim 9, which is a backlight type liquid crystal display device.

12. A method for reducing laser speckle noise, comprising:
providing a fine particle dispersion containing fine particles having an average particle size of 120 nm or more and 500 nm or less and a liquid medium transmitting light sealed in the transparent diffusion cell for laser light in which a liquid can be sealed and having a concentration of 0.1% by weight or more and 25% by weight or less of the fine particles to the total amount of the dispersion and a viscosity of 0.1 mPa·s or more and 10000 mPa·s or less at 25° C., and,
transmitting laser light through said light diffusion cell to turn coherent laser light to incoherent emission light.

* * * * *